United States Patent
Jing

(10) Patent No.: US 10,207,290 B2
(45) Date of Patent: Feb. 19, 2019

(54) COATING METHOD AND COATING DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Yangkun Jing, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/132,571

(22) Filed: Apr. 19, 2016

(65) Prior Publication Data

US 2016/0361736 A1    Dec. 15, 2016

(30) Foreign Application Priority Data

Jun. 12, 2015   (CN) .......................... 2015 1 0324314

(51) Int. Cl.
    *B05D 1/28* (2006.01)
    *B05C 1/00* (2006.01)
    (Continued)

(52) U.S. Cl.
    CPC .................. *B05D 1/28* (2013.01); *B05C 1/00* (2013.01); *B05C 1/025* (2013.01); *B05C 1/0895* (2013.01);
    (Continued)

(58) Field of Classification Search
    CPC ....................................................... B05D 1/28
    See application file for complete search history.

(56) References Cited

U.S. PATENT DOCUMENTS

| 5,413,806 A * | 5/1995 | Braun ..................... B05C 1/083 |
| | | 118/224 |
| 2003/0017256 A1 | 1/2003 | Shimane |
| 2005/0189227 A1 | 9/2005 | Wilson et al. |

FOREIGN PATENT DOCUMENTS

| CN | 1392594 A | 1/2003 |
| CN | 1552091 A | 12/2004 |

(Continued)

OTHER PUBLICATIONS

Office Action dated Nov. 14, 2016 Issued in Corresponding Chinese Application No. 201510324314.1.

(Continued)

*Primary Examiner* — Nathan H Empie
(74) *Attorney, Agent, or Firm* — Nath, Goldberg & Meyer; Joshua B. Goldberg

(57) ABSTRACT

The present invention provides a coating method for coating an adhesive solution on a substrate to form a film layer. The coating method comprises the following steps: S1, obtaining an initial value of a coating parameter corresponding to a target thickness of the film layer based on at least one functional relation between a thickness of the film layer formed within a predetermined period and at least one coating parameter; S2, starting to coat in accordance with the initial value of the coating parameter obtained in step S1, so that the thickness of the film layer obtained reaches an initial target thickness. Accordingly, the present invention further provides a coating device. According to the present invention, the value of the coating parameter can be determined quickly, thereby coating efficiency can be increased.

6 Claims, 3 Drawing Sheets

(51) Int. Cl.
    *B05D 1/00*           (2006.01)
    *B05C 1/02*           (2006.01)
    *B05C 1/08*           (2006.01)
    *H01L 21/67*          (2006.01)

(52) U.S. Cl.
    CPC ............ *B05D 1/00* (2013.01); *H01L 21/6715* (2013.01); *B05C 1/08* (2013.01)

(56) References Cited

FOREIGN PATENT DOCUMENTS

| | | |
|---|---|---|
| CN | 1392594 A | 1/2013 |
| CN | 103143484 A | 6/2013 |

OTHER PUBLICATIONS

Second Office Action dated Apr. 1, 2017 in corresponding Chinese Application No. 201510324314.1.

\* cited by examiner

COATING METHOD AND COATING DEVICE

TECHNICAL FIELD

The present invention refers to display technology field, specifically refers to a coating method and a coating device (dispenser).

BACKGROUND ART

Organic Light-Emitting Diode (OLED) is an emerging flat panel display, and is widely used because it has many advantages such as active luminescence, high contrast, thinning ability, fast response, and so on.

In the encapsulation process of Organic Light-Emitting Diode, an packaging adhesive (Filler) should be coated onto a substrate of Organic Light-Emitting Diode. However, in the coating process of the packaging adhesive, it is necessary to consider various factors, namely, coating parameters, to control the thickness of the film layer. Coating parameters related to thickness control of the film layer include rotating speed of the coating roller, kind of the adhesive solution, dripping speed of the adhesive solution, temperature of the adhesive solution, ambient humidity, and so on. When starting to coat the adhesive solution, it is necessary to confirm in order to find the optimum values of the coating parameters. However, it takes a very long time for the coating device to confirm the optimum values, thus causing loss on operation of the coating device.

SUMMARY OF INVENTION

An object of the present invention is to provide a coating method and a coating device, thereby coating efficiency can be increased.

In order to achieve the object above, the present invention provides a coating method for coating an adhesive solution on a substrate to form a film layer, characterized in that, said coating method comprises the following steps:

S1, obtaining an initial value of a coating parameter corresponding to a target thickness of the film layer based on at least one functional relation between a thickness of the film layer formed within a predetermined period and at least one coating parameter;

S2, starting to coat in accordance with the initial value of the coating parameter obtained in step S1, so that the thickness of the film layer obtained reaches an initial target thickness.

Preferably, there are multiple coating parameters, and each of them has a functional relation with the thickness of the film layer formed within a predetermined period.

Preferably, a coating device for performing said coating method comprises an adhesive solution storage tank, a transfer roller and a coating roller, said adhesive solution storage tank is used for providing the adhesive solution to said transfer roller, said transfer roller is used for transferring the adhesive solution onto said coating roller, said coating roller is used for coating the adhesive solution on the substrate, said coating parameters include: at least one of rotating speed of the coating roller, dripping speed of the adhesive solution to said transfer roller, distance between the shaft of the coating roller and the substrate, concentration of the adhesive solution, temperature of the adhesive solution, ambient temperature, and ambient humidity.

Preferably, said coating method further comprises the following steps before step S1:

for every coating parameter:

setting multiple test values of the coating parameter;

measuring multiple test thicknesses of the film layers formed by coating under multiple test values of the coating parameter within a predetermined period;

obtaining a functional relation between the thickness of said film layer and the coating parameter based on multiple test values of the coating parameter and corresponding multiple test thicknesses.

Preferably, said coating method further comprises the following steps before step S1:

dividing the substrate into multiple areas arranged in sequence;

performing said step S1 and said step S2 in the first area in the multiple areas;

said coating method further comprises the following steps starting from the second area in the multiple areas:

S3, measuring the actual thickness of the film layer in the former area;

S4, obtaining a reference value of each coating parameter corresponding to said actual thickness based on each functional relation;

S5, performing a first correction to said coating parameters according to a difference between the reference value and the initial value of each coating parameter, thereby obtaining a first correction value of each coating parameter;

S6, proceeding to coat the adhesive solution on the current area in accordance with the first correction value of said coating parameter obtained in S5, and setting the first correction value as the initial value of the coating parameter in the next area.

Preferably, each of the functional relations can form a function curve, and step S5 includes:

calculating the first correction value of each coating parameter based on formula (1) and formula (2):

$$a'_i = a0_i + m_i(a0_i - a1_i) \quad (1)$$

$$m_i = \frac{|k_i|}{\sum_{j=1}^{N} |k_j|} \quad (2)$$

wherein, $a_i'$ represents the first correction value of No. i coating parameter;

$a0_i$ represents the initial value of No. i coating parameter corresponding to the target thickness of the film layer;

$a1_i$ represents the reference value of No. i coating parameter corresponding to the actual thickness;

$k_i$ represents the tangent slope at the point corresponding to the actual thickness on the function curve of the thickness of the film layer and No. i coating parameter;

$k_j$ represents the tangent slope at the point corresponding to the actual thickness on the function curve of the thickness of the film layer and No. j coating parameter;

N represents the number of the coating parameters;

$1 \le i \le N$, $1 \le j \le N$, and i and j are both integer. (1) (2) represents initial value of No. i coating parameter corresponding to target thickness of film layer; represents reference value of No. i coating parameter corresponding to actual thickness;

Preferably, said coating method further comprises the following steps after the coating of the multiple areas on the whole substrate is completed and the film layers are formed:

S7, measuring the actual thicknesses of multiple detection positions of the film layer;

S8, for each detection position, obtaining a reference value of each coating parameter corresponding to the actual thickness of the detection position based on each functional relation;

S9, for each detection position, performing a second correction to each coating parameter according to a difference between the reference value of each coating parameter and the value of each coating parameter when the detection position is coated, thereby obtaining second correction values of multiple coating parameters corresponding to the detection position;

S10, setting the second correction values of multiple coating parameters as the initial values of the coating parameters of the next substrate, thereby starting to coat the adhesive solution on the next substrate.

Preferably, step S9 includes:

calculating the second correction value of each coating parameter corresponding to anyone of the detection positions based on formula (3) and formula (4):

$$b'_{p,x} = b0_{p,x} + n_{p,x}(b0_{p,x} - b1_{p,x}) \quad (3)$$

$$n_{p,x} = \frac{|c_{p,x}|}{\sum_{y=1}^{N} |c_{p,y}|} \quad (4)$$

wherein, $b_{p,x}'$ represents the second correction value of No. x coating parameter corresponding to No. p detection position;

$b0_{p,x}$ represents the value of No. x coating parameter when coating No. p detection position;

$b1_{p,x}$ represents the reference value of No. x coating parameter corresponding to No. p detection position;

N represents the number of the coating parameters;

$c_{p,x}$ represents the tangent slope at the point corresponding to the actual thickness of No. p detection position on the function curve of the thickness of the film layer and No. x coating parameter;

$c_{p,y}$ represents the tangent slope at the point corresponding to the actual thickness of No. p detection position on the function curve of the thickness of the film layer and No. y coating parameter;

N represents the number of the coating parameters;

$1 \leq x \leq N$, $1 \leq y \leq N$, and x and y are both integer. (3) (4) represents value of No. x coating parameter when No. p detection position is coated; represents reference value of No. x coating parameter corresponding to No. p detection position; represents tangent slope at the point corresponding to actual thickness of No. p detection position on the function curve of the thickness of film layer and No. x coating parameter; represents tangent slope at the point corresponding to actual thickness Accordingly, the present invention further provides a coating device, it comprises: module coating parameter acquiring module, a control module and a coating module, said coating parameter acquiring module is used for obtaining an initial value of a coating parameter corresponding to a target thickness of the film layer based on at least one functional relation between a thickness of the film layer formed within a predetermined period and at least one coating parameter;

said control module is used for controlling said coating module to start to coat in accordance with the initial value of said coating parameter, so that the thickness of the film layer obtained reaches an initial target thickness of the film layer.

Preferably, there are multiple coating parameters, and each of them has a functional relation with the thickness of the film layer formed within a predetermined period.

Preferably, said coating module comprises an adhesive solution storage tank, a transfer roller and a coating roller, said adhesive solution storage tank is used for providing the adhesive solution to said transfer roller, said transfer roller is used for transferring the adhesive solution onto said coating roller, said coating roller is used for coating the adhesive solution on the substrate, said coating parameters include: at least one of rotating speed of the coating roller, dripping speed of the adhesive solution to said transfer roller, distance between the shaft of the coating roller and the substrate, concentration of the adhesive solution, temperature of the adhesive solution, ambient temperature, and ambient humidity.

Preferably, said coating device further comprises:

a test value setting module, for setting multiple test values of each coating parameter;

a thickness measuring module, for measuring multiple test thicknesses of the film layers formed under multiple test values of each coating parameter within a predetermined period;

a functional relation acquiring module, for obtaining functional relation between the thickness of the film layer and each coating parameter based on multiple test values of each coating parameter and multiple test thicknesses.

Preferably, said substrate is divided into multiple areas arranged in sequence, said coating module can coat the adhesive solution in the first area in the multiple areas, and from the second area in the multiple areas, said thickness measuring module can measure the actual thickness of the film layer formed in the former area, said coating device further comprises:

a reference value acquiring module, for obtaining a reference value of each coating parameter corresponding to said actual thickness based on each functional relation;

a coating parameter first correction module, for performing a first correction to said coating parameters according to a difference between the reference value and the initial value of each coating parameter, thereby obtaining a first correction value of each coating parameter, and setting the first correction value as the initial value of the coating parameter in the next area;

said control module can control said coating module to proceed to coat the adhesive solution on the current area in accordance with the first correction value of said coating parameter.

Preferably, each of the functional relations can form a function curve, said coating parameter first correction module can calculate the first correction value of each coating parameter based on formula (1) and formula (2):

$$a'_i = a0_i + m_i(a0_i - a1_i) \quad (1)$$

$$m_i = \frac{|k_i|}{\sum_{j=1}^{N} |k_j|} \quad (2)$$

wherein, $a_i'$ represents the first correction value of No. i coating parameter;

$a0_i$ represents the initial value of No. i coating parameter corresponding to the target thickness of the film layer;

$a1_i$ represents the reference value of No. i coating parameter corresponding to the actual thickness;

$k_i$ represents the tangent slope at the point corresponding to the actual thickness on the function curve of the thickness of the film layer and No. i coating parameter;

$k_j$ represents the tangent slope at the point corresponding to the actual thickness on the function curve of the thickness of the film layer and No. j coating parameter;

N represents the number of the coating parameters;

1≤i≤N, 1≤j≤N, and i and j are both integer.

represents initial value of No. i coating parameter corresponding to target thickness of film layer; represents reference value of No. i coating parameter corresponding to actual thickness; Preferably, said thickness measuring module can further measure the actual thicknesses of multiple detection positions of the film layer after the coating of multiple areas on the whole substrate is completed and the film layers are formed, for each detection position, said reference value acquiring module can obtain a reference value of each coating parameter corresponding to the actual thickness of the detection position based on each functional relation;

said coating device further comprises a coating parameter second correction module, for each detection position, said coating parameter second correction module can perform a second correction to each coating parameter according to a difference between the reference value of each coating parameter and the value of each coating parameter when the detection position is coated, thereby obtaining second correction values of multiple coating parameters corresponding to the detection position;

said control module can set the second correction values of multiple coating parameters as the initial value of the coating parameters of the next substrate, thereby controlling said coating module to start to coat the adhesive solution on the next substrate.

Preferably, said coating parameter second correction module can obtain the second correction value of each coating parameter corresponding to anyone of the detection positions based on formula (3) and formula (4):

$$b'_{p,x} = b0_{p,x} + n_{p,x}(b0_{p,x} - b1_{p,x}) \quad (3)$$

$$n_{p,x} = \frac{|c_{p,x}|}{\sum_{y=1}^{N} |c_{p,y}|} \quad (4)$$

wherein, $b_{p,x}'$ represents the second correction value of No. x coating parameter corresponding to No. p detection position;

$b0_{p,x}$ represents the value of No. x coating parameter when coating No. p detection position;

$b1_{p,x}$ represents the reference value of No. x coating parameter corresponding to No. p detection position;

N represents the number of the coating parameters;

$c_{p,x}$ represents the tangent slope at the point corresponding to the actual thickness of No. p detection position on the function curve of the thickness of the film layer and No. x coating parameter;

$c_{p,y}$ represents the tangent slope at the point corresponding to the actual thickness of No. p detection position on the function curve of the thickness of the film layer and No. y coating parameter;

N represents the number of the coating parameters;

1≤x≤N, 1≤y≤N, and x and y are both integer.

represents value of No. x coating parameter when No. p detection position is coated; represents reference value of No. x coating parameter corresponding to No. p detection position; represents tangent slope at the point corresponding to actual thickness of No. p detection position on the function curve of the thickness of film layer and No. x coating parameter; represents tangent slope at the point corresponding to actual thickness of No. p detection position on the function curve of the thickness of film layer and No. y coating parameter; In the present invention, the functional relation between the thickness of said film layer and the coating parameter can be obtained before mass production. Thereby, the coating parameter can be confirmed in accordance with the relationship between a predetermined thickness of the film layer and the coating parameter in mass production, so that the thickness of the film layer formed by coating reaches the initial target thickness of the film layer, thereby the coating device can confirm the value of the coating parameter more quickly, and increase coating efficiency.

DESCRIPTION OF DRAWINGS

The drawings are used for further understanding the present invention, constituting a part of Specification, and explaining the present invention together with the following embodiments, but they do not limit the scope of the present invention.

In the drawings.

wherein, reference signs are: 10, coating parameter acquiring module; 20, control module; 30, coating module; 31, support table; 32, adhesive solution storage tank; 33, export pipe; 34, transfer roller; 35, coating roller; 36, coating layer; 40, test value setting module; 50, thickness measuring module; 60, functional relation acquiring module; 70, reference value acquiring module; 80, coating parameter first correction module; 90, coating parameter second correction module.

DESCRIPTION OF EMBODIMENTS

Hereafter, embodiments of the present invention will be described in detail with reference to the accompanying figures. It should be understood that, the embodiments described here is used for illustrating and explaining the present invention only, and not intended to limit the present invention.

Figure 1:
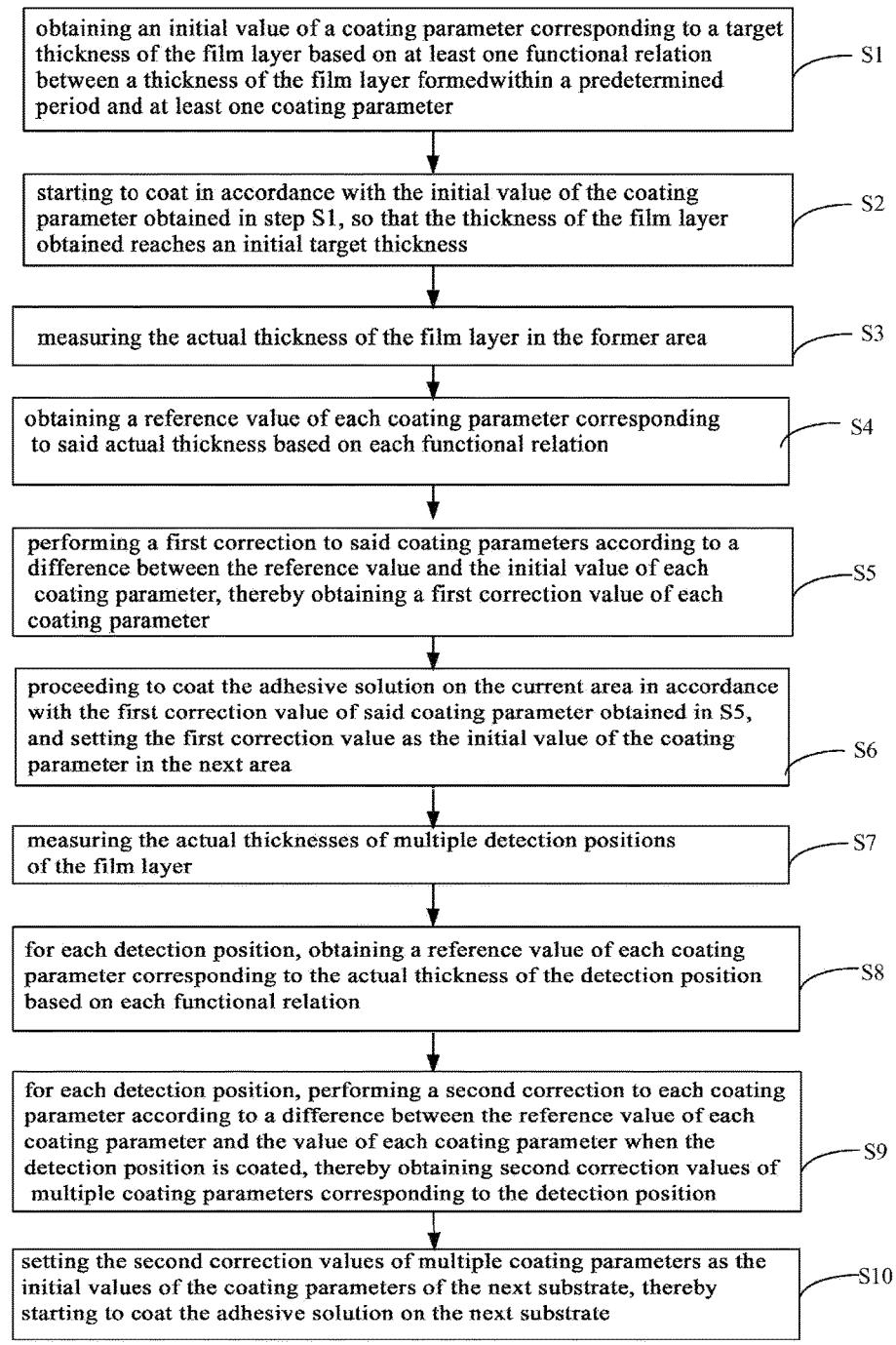
FIG. 1 is a flow chart of the coating method provided in Embodiments of the present invention.

As an embodiment of the present invention, there provides a coating method for coating an adhesive solution on a substrate to form a film layer, as shown in FIG. 1, said coating method comprises the following steps:

S1, obtaining an initial value of a coating parameter corresponding to a target thickness of the film layer based on at least one functional relation between a thickness of the film layer formed within a predetermined period and at least one coating parameter;

S2, starting to coat in accordance with the initial value of the coating parameter obtained in step S1, so that the thickness of the film layer obtained reaches an initial target thickness.

Said coating parameter means a coating factor having an influence on the thickness of the film layer when the adhesive solution is coated, such as dripping speed of the adhesive solution, kind of the adhesive solution, and so on. The thickness of the film layer has a functional relation with each of coating parameters. When the coating parameter is set, a film layer with corresponding thickness can be formed within a predetermined period.

In the present invention, according to the functional relation between the thickness of the film layer and the coating parameter, the initial value of the coating parameter corresponds to said target thickness of the film layer. Therefore, "initial target thickness of the film layer" obtained under the initial value of the coating parameter is the same as said "target thickness of the film layer", theoretically.

The functional relation between the thickness of said film layer and the coating parameter can be obtained before mass production. Thereby, the coating parameter can be confirmed in accordance with the relationship between a predetermined thickness of the film layer and the coating parameter in mass production, so that the thickness of the film layer formed by coating reaches the initial target thickness of the film layer, thereby the coating device can confirm the value of the coating parameter more quickly, and increase coating efficiency. In the present invention, there are multiple coating parameters, accordingly, each of them has a functional relation with the thickness of the film layer formed within a predetermined period. Specifically, step S1 is to obtain the initial value of the coating parameter corresponding to the target thickness of the film layer based on each functional relation.

Specifically, coating device for performing said coating method comprises an adhesive solution storage tank, a transfer roller and a coating roller, said adhesive solution storage tank is used for providing the adhesive solution to said transfer roller, said transfer roller is used for transferring the adhesive solution onto said coating roller, said coating roller is used for coating the adhesive solution on the substrate, said coating parameters include: at least one of rotating speed of the coating roller, dripping speed of the adhesive solution to said transfer roller, distance between the shaft of the coating roller and the substrate, concentration of the adhesive solution, temperature of the adhesive solution, ambient temperature, and ambient humidity.

As described above, the functional relation between the thickness of said film layer and the coating parameter can be obtained before mass production. As an embodiment of the present invention, said coating method further comprises the following steps before step S1:

for every coating parameter:

setting multiple test values of the coating parameter;

measuring multiple test thicknesses of the film layers formed by coating under multiple test values of the coating parameter within a predetermined period; obtaining a functional relation between the thickness of said film layer and the coating parameter based on multiple test values of the coating parameter and corresponding multiple test thicknesses.

For example, when the coating parameter includes the coating test of rotating speed of the coating roller, multiple different rotating speed values can be set, the adhesive solution is coated at each rotating speed value, test thicknesses of the film layers formed are detected, and a function curve between the thicknesses of the film layer and the rotating speed of the coating roller is drawn based on multiple rotating speed values and corresponding test thicknesses values.

It is appreciated that, the test value of each coating parameter has a certain setting range. In the case there are multiple coating parameters, when multiple test values of one of the coating parameters are setting, the values of other coating parameters are constant, and each value of the other coating parameters can be fixed as the average value of corresponding setting range.

For example, when there are three coating parameters: rotating speed of the coating roller, dripping speed of the adhesive solution to the transfer roller, and distance between shaft of the coating roller and the substrate. And in the coating device, rotating speed of the coating roller is in the range of v1~v2, dripping speed of the adhesive solution to the transfer roller is in the range of v3~v4, distance between shaft of the coating roller and the substrate is in the range of d1~d2. Then when obtaining the functional relation between the thickness of the film layer and the rotating speed of the coating roller, the rotating speed of the coating roller can be set as multiple test rotating speeds in the range of v1~v2, the dripping speed of the adhesive solution can be set to (v3+v4)/2, the distance between shaft of the coating roller and the substrate can be set to (d1+d2)/2. The coating of the adhesive solution is performed every time a test rotating speed is set, thereby multiple test thicknesses which correspond to multiple test rotating speeds are measured, then the functional relation between the thickness of the film layer and the rotating speed of the coating roller is obtained. Similarly, the functional relation between the thickness of the film layer and dripping speed of the adhesive solution, and the functional relation between the thickness of the film layer and the distance from the shaft of the coating roller to the substrate can be drawn.

As described above, the thickness of the film layer obtained under the initial value of the coating parameter (namely, initial target thickness of the film layer) is the same as said target thickness of the film layer, theoretically. However, in formal mass production coating, there may be some inevitable errors during device coating, which causes a difference between the actual thickness of the film layer and the target thickness of the film layer, that is, said initial target thickness of the film layer is discordant with the target thickness of the film layer.

The adhesive solution can be coated on different areas of the substrate respectively, said coating method further comprises the following steps before step S1:

dividing the substrate into multiple areas arranged in sequence;

performing said step S1 and said step S2 in the first area in the multiple areas;

said coating method can perform a first correction to the coating parameter based on the thickness of the film layer in coated area, such that the thickness of the film layer in the areas to be coated can reach the target thickness of the film layer. Specifically, as shown in FIG. 1, said coating method further comprises the following steps starting from the second area in the multiple areas:

S3, measuring the actual thickness of the film layer in the former area;

S4, obtaining a reference value of each coating parameter corresponding to said actual thickness based on each functional relation;

S5, performing a first correction to said coating parameters according to a difference between the reference value and the initial value of each coating parameter, thereby obtaining a first correction value of each coating parameter;

S6, proceeding to coat the adhesive solution on the current area in accordance with the first correction value of said coating parameter obtained in S5, and setting the first correction value as the initial value of the coating parameter in the next area.

In mass production, the actual thickness of the film layer formed by coating the adhesive solution under the initial value of the coating parameter and said target thickness of the film layer are not necessarily the same. When the actual thickness of the film layer formed in No. S area is discordant with said target thickness of the film layer, the actual thickness of the film layer formed in No. S+1 area can reach the target thickness of the film layer by correcting the coating parameter.

In the present invention, each of the functional relations between the thickness of the film layer and each coating parameter can form a function curve. Specifically, step S5 includes:

calculating the first correction value of each coating parameter based on formula (1) and formula (2):

$$a'_i = a0_i + m_i(a0_i - a1_i) \qquad (1)$$

$$m_i = \frac{|k_i|}{\sum_{j=1}^{N} |k_j|} \qquad (2)$$

wherein, $a_i'$ represents the first correction value of No. i coating parameter;

$a0_i$ represents the initial value of No. i coating parameter corresponding to the target thickness of the film layer;

$a1_i$ represents the reference value of No. i coating parameter corresponding to the actual thickness;

$k_i$ represents the tangent slope at the point corresponding to the actual thickness on the function curve of the thickness of the film layer and No. i coating parameter;

$k_j$ represents the tangent slope at the point corresponding to the actual thickness on the function curve of the thickness of the film layer and No. j coating parameter;

N represents the number of the coating parameters;

$1 \leq i \leq N$, $1 \leq j \leq N$, and i and j are both integer.

Figure 2:
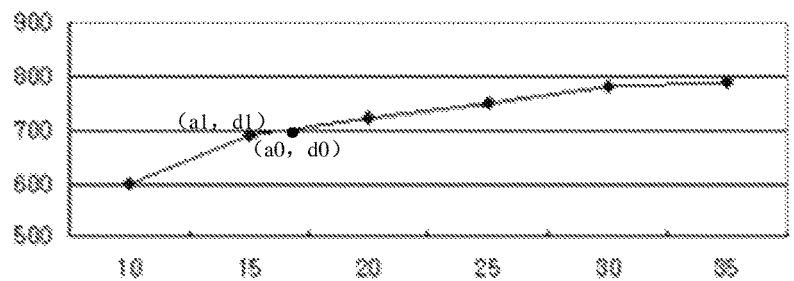
FIG. 2 is a function curve between the thickness of the film layer and the rotating speed of the coating roller.

(1) (2) represents initial value of No. i coating parameter corresponding to target thickness of film layer; represents reference value of No. i coating parameter corresponding to actual thickness; When the number of the coating parameters is one, formula (1) is: $a_i'=a0_i+(a0_i-a1_i)$. For example, the coating parameters only include the rotating speed of the coating roller, and the function curve between the thickness of the film layer and the rotating speed of the coating roller is shown in FIG. 2, wherein the horizontal axis represents the rotating speed of the coating roller, which is represented by moving speed of the substrate (unit: meter/minute) here, and the vertical axis represents the thickness of the film layer (unit: angstrom). In the obtained functional relation between the thickness of the film layer and the rotating speed of the coating roller, the thickness of the film layer formed when the speed is a0 is the target thickness of the film layer d0. However, in the actual mass production, the actual thickness of the film layer formed when the speed is a0 is d1. In this case, a reference speed a1 corresponding to the actual thickness d1 can be obtained according to the function curve in FIG. 2, and the rotating speed of the coating roller is adjusted to a'=a0+a0−a1 to proceed coating.

When there are multiple coating parameters, step S5 needs to correct each coating parameter respectively. As different coating parameters have different influences on the thickness of the film layer, different coating parameters have different degree of correction. In formula (1), $m_i$ represents the influence degree of No. i coating parameter on the thickness of the film layer. From formula (2) it can be seen that, the absolute value of the tangent slope at the point corresponding to the actual thickness on the function curve of the thickness of the film layer and each coating parameter is counted, when the proportion of the absolute value of the tangent slope corresponding to No. i coating parameter to the sum of multiple absolute values of the tangent slope is larger, No. i coating parameter has larger influence on the thickness of the film layer, therefore No. i coating parameter has a larger degree of correction.

In step S3, when measuring the thickness of the film layer portion formed in the former area, the thickness of the film layer can be measured at one detection point only, or can be measured at multiple detection points and then the average value of these thicknesses at multiple detection points is set as the actual thickness of the film layer portion formed.

After the coating on the whole substrate is completed and the film layers are formed, the thicknesses of the film layer at different positions may be inconsistent. In order to reduce the difference of the thicknesses of the film layers at different positions, as shown in FIG. 1, said coating method further comprises the following steps after the coating of the multiple areas on the whole substrate is completed and the film layers are formed:

S7, measuring the actual thicknesses of multiple detection positions of the film layer;

S8, for each detection position, obtaining a reference value of each coating parameter corresponding to the actual thickness of the detection position based on each functional relation;

S9, for each detection position, performing a second correction to each coating parameter according to a difference between the reference value of each coating parameter and the value of each coating parameter when the detection position is coated, thereby obtaining second correction values of multiple coating parameters corresponding to the detection position;

S10, setting the second correction values of multiple coating parameters as the initial values of the coating parameters of the next substrate, thereby starting to coat the adhesive solution on the next substrate.

As described above, when coating the same substrate, the adhesive solution is coated to multiple areas respectively in sequence. Therefore, as for the detection position of the first area, said "the value of each coating parameter when the detection position is coated" in step S9 means the initial value of each coating parameter obtained in step S1; as for the detection positions of other areas, said "the value of each coating parameter when the detection position is coated" in step S9 means the initial value of each coating parameter obtained in step S5. By performing the second correction to the coating parameters at each detection position in step S9, the actual thicknesses of the film layers at multiple detection positions can reach the target thicknesses of the film layers when the next substrate is coated, thereby the thickness uniformity of the film layer is increased.

Specifically, step S9 includes:

calculating the second correction value of each coating parameter corresponding to anyone of the detection positions based on formula (3) and formula (4):

$$b'_{p,x} = b0_{p,x} + n_{p,x}(b0_{p,x} - b1_{p,x}) \quad (3)$$

$$n_{p,x} = \frac{|c_{p,x}|}{\sum_{y=1}^{N} |c_{p,y}|} \quad (4)$$

wherein, $b_{p,x}'$ represents the second correction value of No. x coating parameter corresponding to No. p detection position;

$b0_{p,x}$ represents the value of No. x coating parameter when coating No. p detection position;

$b1_{p,x}$ represents the reference value of No. x coating parameter corresponding to No. p detection position;

N represents the number of the coating parameters;

$c_{p,x}$ represents the tangent slope at the point corresponding to the actual thickness of No. p detection position on the function curve of the thickness of the film layer and No. x coating parameter;

$c_{p,y}$ represents the tangent slope at the point corresponding to the actual thickness of No. p detection position on the function curve of the thickness of the film layer and No. y coating parameter;

N represents the number of the coating parameters;

$1 \le x \le N$, $1 \le y \le N$, and x and y are both integer. (3) (4) represents value of No. x coating parameter when No. p detection position is coated; represents reference value of No. x coating parameter corresponding to No. p detection position; represents tangent slope at the point corresponding to actual thickness of No. p detection position on the function curve of the thickness of film layer and No. x coating parameter; represents tangent slope at the point corresponding to actual thickness of No. p detection position on the function curve of the thickness of film layer and No. y coating parameter;

The thickness of the film layer and each of the coating parameter form a function curve. In formula (4), $\Sigma_{y=1}^{N}|c_{p,y}|$ represents the sum of the absolute value of the tangent slope at the point corresponding to the actual thickness at No. p detection position on N function curves.

For example, the number of the detection positions on the film layer is M, when confirming the second correction value of the coating parameter corresponding to No. p detection position, if there is only one coating parameter, the second correction value of the coating parameter at No. p detection position is: $b_{p,x}'=b0_{p,x}+(b0_{p,x}-b1_{p,x})$. In the same way, the second correction values of the coating parameter at M positions are calculated. Further, the adhesive solution is coated to the next substrate according to the second correction value of the coating parameter. When there are two coating parameters, rotating speed of the coating roller and dripping speed of the adhesive solution, the second correction value of the rotating speed of the coating roller and second correction value of the dripping speed of the adhesive solution at No. p detection position are calculated based on formula (3) and formula (4). In the same way, the second correction value of the rotating speed of the coating roller and the second correction value of the dripping speed of the adhesive solution at each position are calculated, to proceeding coating the next substrate, thereby the thicknesses of the film layers at multiple detection positions reach the target thicknesses after the coating on the next substrate is completed, and the uniformity of the film layer is increased.

Figure 3:
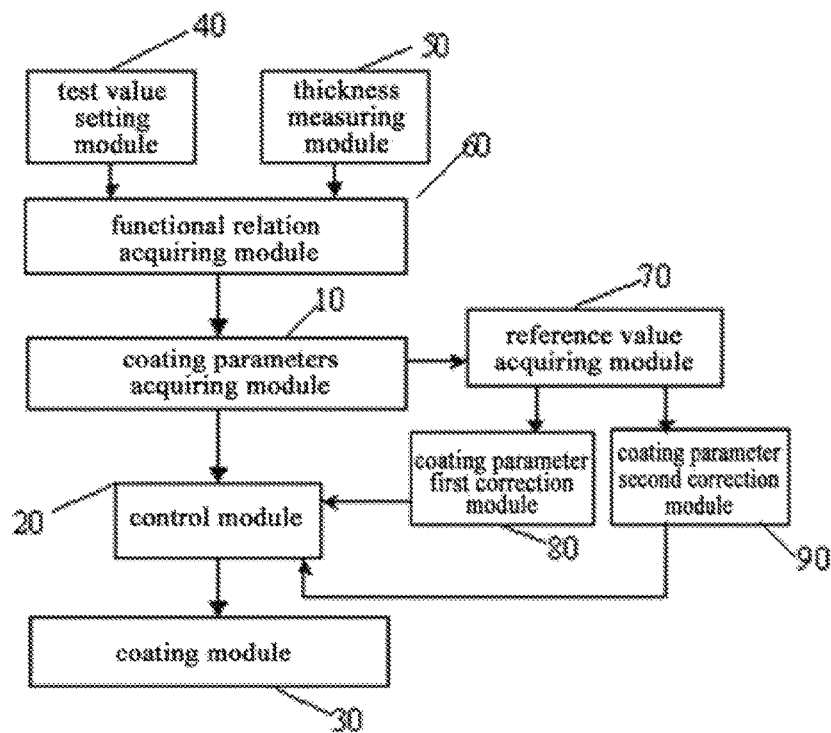
FIG. 3 is a schematic view of modules in Embodiments of the present invention.

As a second embodiment of the present invention, there provides a coating device, as shown in FIG. 3, it comprises: module coating parameter acquiring module 10, a control module 20 and a coating module 30, the coating parameter acquiring module 10 is used for obtaining an initial value of a coating parameter corresponding to a target thickness of the film layer based on at least one functional relation between a thickness of the film layer formed within a predetermined period and at least one coating parameter; the control module 20 is used for controlling the coating module 30 to start to coat in accordance with the initial value of said coating parameter, so that the thickness of the film layer obtained reaches an initial target thickness of the film layer.

Specifically, there can be multiple coating parameters, and each of them has a functional relation with the thickness of the film layer formed within a predetermined period.

Figure 4:
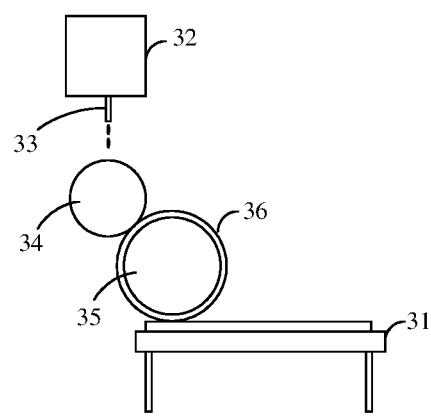
FIG. 4 is a schematic view of the structure of the coating module.

As shown in FIG. 4, the coating module 30 may comprise an adhesive solution storage tank 32, a transfer roller 34 and a coating roller 35. The adhesive solution storage tank 32 is used for providing the adhesive solution to transfer roller 34, the transfer roller 34 is used for transferring the adhesive solution onto coating roller 35, and the coating roller 35 is used for coating said adhesive solution on the substrate. The coating module 30 may further comprise structures such as a support table 31, an export pipe 33 connected with the adhesive solution storage tank 32. The support table 31 is used for supporting the substrate, the export pipe 33 is used for injecting the adhesive solution in the adhesive solution storage tank 32 to the transfer roller 34, the coating roller 35 is coated with a coating layer 36 made of piezoelectric materials, thereby the adhesive solution is coated onto the substrate uniformly.

Specifically, said coating parameter includes: at least one of rotating speed of the coating roller, dripping speed of the adhesive solution to said transfer roller, distance between the shaft of the coating roller and the substrate, concentration of the adhesive solution, temperature of the adhesive solution, ambient temperature, and ambient humidity.

Accordingly, the motor of the coating roller 35, the electromagnetic valve of the export pipe 33, the shaft of the coating roller 35, the motor of the support table, and the heating element used for heating the adhesive solution and so on can connect with the control module 20, so that the control module 20 controls the rotating speed of the coating roller, the dripping speed of the adhesive solution, the distance between the shaft of the coating roller and the substrate, and the temperature of the adhesive solution.

Furthermore, as shown in FIG. 3, said coating device further comprises:

a test value setting module 40, for setting multiple test values of each coating parameter;

a thickness measuring module 50, for measuring multiple test thicknesses of the film layers formed under multiple test values of each coating parameter within a predetermined period;

a functional relation acquiring module 60, for obtaining functional relation between the thickness of the film layer and each coating parameter based on multiple test values of each coating parameter and multiple test thicknesses.

The thickness of the film layer has a functional relation with each of coating parameters respectively, the coating parameter acquiring module 10 can obtain the initial value of each coating parameter corresponding to said target thickness of the film layer based on each functional relation.

In the present invention, said substrate is divided into multiple areas arranged in sequence, coating module 30 can coat the adhesive solution in the first area in the multiple areas, and from the second area in the multiple areas, the thickness measuring module 50 can measure the actual thickness of the film layer formed in the former area, furthermore, as shown in FIG. 3, said coating device further comprises:

a reference value acquiring module 70, for obtaining a reference value of each coating parameter corresponding to said actual thickness based on each functional relation;

a coating parameter first correction module 80, for performing a first correction to said coating parameters according to a difference between the reference value and the initial value of each coating parameter, thereby obtaining a first correction value of each coating parameter, and setting the first correction value as the initial value of the coating parameter in the next area;

the control module 20 can control the coating module 30 to proceed to coat the adhesive solution on the current area in accordance with the first correction value of said coating parameter.

Therefore, when a part of the film layer is formed, and the actual thickness of the formed film layer is different from the target thickness of the film layer, by detecting the actual thickness of the formed film layer, and performing the first correction to the coating parameter, the difference between the actual thickness of the film layer formed by subsequent coating and the target thickness of the film layer can be reduced.

As described above, each of the functional relations can form a function curve. Specifically, when performing the first correction to the coating parameters, the coating parameter first correction module 80 can calculate first correction value of each coating parameter based on formula (1) and formula (2):

$$a'_i = a0_i + m_i(a0_i - a1_i) \tag{1}$$

$$m_i = \frac{|k_i|}{\sum_{j=1}^{N} |k_j|} \tag{2}$$

wherein, $a_i'$ represents the first correction value of No. i coating parameter;

$a0_i$ represents the initial value of No. i coating parameter corresponding to the target thickness of the film layer;

$a1_i$ represents the reference value of No. i coating parameter corresponding to the actual thickness;

$k_i$ represents the tangent slope at the point corresponding to the actual thickness on the function curve of the thickness of the film layer and No. i coating parameter;

$k_j$ represents the tangent slope at the point corresponding to the actual thickness on the function curve of the thickness of the film layer and No. j coating parameter;

N represents the number of the coating parameters;

$1 \leq i \leq N$, $1 \leq j \leq N$, and i and j are both integer.

represents initial value of No. i coating parameter corresponding to target thickness of film layer; represents reference value of No. i coating parameter corresponding to actual thickness; Furthermore, the thickness measuring module 50 can further measure the actual thicknesses of multiple detection positions of the film layers after the coating of multiple areas on the whole substrate is completed and the film layers are formed, and for each detection position, the reference value acquiring module 70 can obtain a reference value of each coating parameter corresponding to the actual thickness of the detection position based on each functional relation;

said coating device may further comprise a coating parameter second correction module 90, or each detection position, the coating parameter second correction module 90 can perform a second correction to each coating parameter according to a difference between the reference value of each coating parameter and the value of each coating parameter when the detection position is coated, thereby obtaining second correction values of multiple coating parameters corresponding to the detection position;

the control module 20 can set the second correction values of multiple coating parameters as the initial value of the coating parameters of the next substrate, thereby controlling the coating module 30 to start to coat the adhesive solution on the next substrate.

That is, when the coating on the whole substrate is completed and the film layer is formed, the thickness measuring module 50 can detect the thickness of the film layer at different positions, and perform the second correction to the coating parameters at each positions. After the correction, the adhesive solution is coated to the next substrate using the current value of the coating parameter, so that when the adhesive solution is coated to the next substrate, the actual thicknesses of the film layers at each detection position can reach the target thicknesses respectively, thereby the thickness uniformity of the film layer can be increased.

Specifically, the coating parameter second correction module 90 can obtain the second correction value of each coating parameter corresponding to anyone of the detection positions based on formula (3) and formula (4):

$$b'_{p,x} = b0_{p,x} + n_{p,x}(b0_{p,x} - b1_{p,x}) \tag{3}$$

$$n_{p,x} = \frac{|c_{p,x}|}{\sum_{y=1}^{N} |c_{p,y}|} \tag{4}$$

wherein, $b_{p,x}'$ represents the second correction value of No. x coating parameter corresponding to No. p detection position;

$b0_{p,x}$ represents the value of No. x coating parameter when coating No. p detection position;

$b1_{p,x}$ represents the reference value of No. x coating parameter corresponding to No. p detection position;

N represents the number of the coating parameters;

$c_{p,x}$ represents the tangent slope at the point corresponding to the actual thickness of No. p detection position on the function curve of the thickness of the film layer and No. x coating parameter;

$c_{p,y}$ represents the tangent slope at the point corresponding to the actual thickness of No. p detection position on the function curve of the thickness of the film layer and No. y coating parameter;

N represents the number of the coating parameters;

$1 \leq x \leq N$, $1 \leq y \leq N$, and x and y are both integer.

represents value of No. x coating parameter when No. p detection position is coated; represents reference value of No. x coating parameter corresponding to No. p detection position; represents tangent slope at the point corresponding to actual thickness of No. p detection position on the function curve of the thickness of film layer and No. x coating parameter; represents tangent slope at the point corresponding to actual thickness of No. p detection position on the function curve of the thickness of film layer and No. y coating parameter; It can be seen that, in the present invention, the functional relation between the thickness of the film layer and the coating parameter is obtained before mass production. The initial value of the coating parameter in accordance with the target thickness of the film layer can be confirmed quickly according to the functional relation during mass production, thereby the coating efficiency can be increased. Furthermore, when the actual thickness of the film layer formed by coating is discordant with target thickness of the film layer, the first correction can be performed to the coating parameter according to the reference value corresponding to the actual thickness and the initial value corresponding to the target thickness of the film layer, so that the actual thickness of the film layer formed in subsequent area reaches the target thickness of the film layer. In addition, when all areas on the whole substrate are coated and the film layers are formed, the second correction can be performed to the coating parameters at different detection positions, and the corrected values of the coating parameters are set as the initial values of the coating parameters of the next substrate to for coating, so that the thickness of the film layer coated on the next substrate becomes more uniform.

It should be understood that the above embodiments of the invention have been described only for illustrating the principle of the present invention, but not intended to limit the present invention. The person skilled in the art can make various modifications and variations of the invention without departing from the spirit and scope of the invention, thus the modifications and variations of the invention are also included within the scope of the present invention.

The invention claimed is:

1. A coating method for coating an adhesive solution on a substrate to form a film layer, characterized in that, said coating method comprises the following steps:
    S1, obtaining an initial value of one or more coating parameters corresponding to a target thickness of the film layer based on at least one functional relation between a thickness of the film layer formed within a predetermined period and each of said one or more coating parameters;
    S2, starting to coat in accordance with the initial value of said coating parameter obtained in step S1, so that the thickness of the film layer obtained reaches an initial target thickness,
    said coating method further comprises the following steps:
    dividing the substrate into multiple areas arranged in sequence before step S1;
    and then performing said step S1 and said step S2 in a first area in the multiple areas,
    said coating method further comprises the following steps in each of the multiple areas in sequence as arranged, starting from a second area in the multiple areas and proceeding until all of the multiple areas are coated:
    S3, measuring an actual thickness of the film layer in a former area immediately sequentially before a current area;
    S4, obtaining a reference value of each of said one or more coating parameters corresponding to said actual thickness based on each functional relation;
    S5, performing a first correction to each of said one or more coating parameters according to a difference between the reference value and the initial value of each of said one or more coating parameters, thereby obtaining a first correction value of each of said one or more coating parameters;
    S6, coating the adhesive solution on the current area in accordance with the first correction value of each of said one or more coating parameters obtained in S5, and setting the first correction value as the initial value of each of said one or more coating parameters in the next area,
    each of the functional relations can form a function curve, and step S5 includes:
    calculating the first correction value of each coating parameter based on formula (1) and formula (2):

$$a_i' = a0_i + m_i(a0_i - a1_i) \quad (1)$$

$$m_i = \frac{|k_i|}{\sum_{j=1}^{N} |k_j|} \quad (2)$$

wherein, $a_i'$ represents the first correction value of No. i coating parameter;
$a0_i$ represents the initial value of No. i coating parameter corresponding to the target thickness of the film layer;
$a1_i$ represents the reference value of No. i coating parameter corresponding to the actual thickness;
$k_i$ represents the tangent slope at the point corresponding to the actual thickness on the function curve of the thickness of the film layer and No. i coating parameter;
$k_j$ represents the tangent slope at the point corresponding to the actual thickness on the function curve of the thickness of the film layer and No. j coating parameter;
N represents the number of the one or more coating parameters;
$1 \leq i \leq N$, $1 \leq j \leq N$, and i and j are both integer.

2. The coating method according to claim 1, characterized in that, there are multiple coating parameters, and each of them has a functional relation with the thickness of the film layer formed within a predetermined period.

3. The coating method according to claim 2, characterized in that, a coating device for performing said coating method comprises an adhesive solution storage tank, a transfer roller and a coating roller, said adhesive solution storage tank is used for providing the adhesive solution to said transfer roller, said transfer roller is used for transferring the adhesive solution onto said coating roller, said coating roller is used for coating the adhesive solution on the substrate, said coating parameters include: at least one of rotating speed of the coating roller, dripping speed of the adhesive solution to said transfer roller, distance between the shaft of the coating roller and the substrate, concentration of the adhesive solution, temperature of the adhesive solution, ambient temperature, and ambient humidity.

4. The coating method according to claim 2, characterized in that, said coating method further comprises the following steps before step S1:
    for each of said coating parameters:
    setting multiple test values of the coating parameter;
    measuring multiple test thicknesses of the film layers formed by coating under multiple test values of the coating parameter within a predetermined period;

obtaining a functional relation between the thickness of said film layer and the coating parameter based on multiple test values of the coating parameter and corresponding multiple test thicknesses.

5. The coating method according to claim 1, characterized in that, said coating method further comprises the following steps after the coating of the multiple areas on the whole substrate is completed and the film layers are formed:

S7, measuring the actual thicknesses of multiple detection positions of the film layer;

S8, for each detection position, obtaining a reference value of each of said one or more coating parameters corresponding to the actual thickness of the detection position based on each functional relation;

S9, for each detection position, performing a second correction to each of said one or more coating parameters according to a difference between the reference value of each of said one or more coating parameters and the value of each of said one or more coating parameters when the detection position is coated, thereby obtaining a second correction value of each of said one or more coating parameters corresponding to the detection position;

S10, setting the second correction values of each of said one or more coating parameters as the initial values of each of said one or more coating parameters of the next substrate, thereby starting to coat the adhesive solution on the next substrate.

6. The coating method according to claim 5, characterized in that, step S9 includes:
calculating the second correction value of each coating parameter corresponding to anyone of the detection positions based on formula (3) and formula (4):

$$b'_{p,x} = b0_{p,x} + n_{p,x}(b0_{p,x} - b1_{p,x}) \qquad (3)$$

$$n_{p,x} = \frac{|c_{p,x}|}{\sum_{y=1}^{N} |c_{p,y}|} \qquad (4)$$

wherein, $b_{p,x}'$ represents the second correction value of No. x coating parameter corresponding to No. p detection position;

$b0_{p,x}$ represents the value of No. x coating parameter when coating No. p detection position;

$b1_{p,x}$ represents the reference value of No. x coating parameter corresponding to No. p detection position;

N represents the number of the coating parameters;

$c_{p,x}$ represents the tangent slope at the point corresponding to the actual thickness of No. p detection position on the function curve of the thickness of the film layer and No. x coating parameter;

$c_{p,y}$ represents the tangent slope at the point corresponding to the actual thickness of No. p detection position on the function curve of the thickness of the film layer and No. y coating parameter;

N represents the number of the one or more coating parameters;

$1 \leq x \leq N$, $1 \leq y \leq N$, and x and y are both integer.

* * * * *